(12) United States Patent
Matsubara (10) Patent No.: US 12,009,182 B2
(45) Date of Patent: Jun. 11, 2024

(54) TEMPERATURE CONTROL METHOD AND TEMPERATURE CONTROL DEVICE

(71) Applicant: Tokyo Electron Limited, Tokyo (JP)

(72) Inventor: Ryo Matsubara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 212 days.

(21) Appl. No.: 17/747,504

(22) Filed: May 18, 2022

(65) Prior Publication Data
US 2022/0375728 A1 Nov. 24, 2022

(30) Foreign Application Priority Data
May 20, 2021 (JP) ................. 2021-085183

(51) Int. Cl.
*H01J 37/32* (2006.01)
(52) U.S. Cl.
CPC .. *H01J 37/32522* (2013.01); *H01J 37/32449* (2013.01); *H01J 37/32467* (2013.01)
(58) Field of Classification Search
None
See application file for complete search history.

(56) References Cited

U.S. PATENT DOCUMENTS

| | | | | |
|---|---|---|---|---|
| 2005/0118737 A1* | 6/2005 | Takagi | ............... | H01J 37/3244 118/724 |
| 2010/0111648 A1* | 5/2010 | Tamura | ............ | H01L 21/67778 414/217 |
| 2014/0234992 A1* | 8/2014 | Kubota | ............ | H01L 21/76813 438/9 |
| 2015/0114562 A1* | 4/2015 | Tamura | ................... | H01J 37/34 204/298.23 |
| 2015/0187588 A1* | 7/2015 | Kubota | ............ | H01J 37/32009 438/666 |
| 2017/0200695 A1* | 7/2017 | Rietzler | ............ | H01L 21/67017 |
| 2019/0326138 A1* | 10/2019 | Forderhase | ....... | H01J 37/32724 |
| 2019/0326139 A1* | 10/2019 | Forderhase | ....... | H01L 21/67109 |
| 2019/0376185 A1* | 12/2019 | Yokota | ............. | C23C 16/45572 |
| 2020/0161171 A1* | 5/2020 | Colombeau | ............ | C23C 16/56 |
| 2022/0333236 A1* | 10/2022 | Xu | ..................... | H01J 37/32871 |
| 2022/0415625 A1* | 12/2022 | Kapoor | ............ | H01J 37/32174 |
| 2023/0071933 A1* | 3/2023 | Kapoor | ............. | H01J 37/32724 |
| 2023/0178419 A1* | 6/2023 | Colombeau | ............. | C23C 16/56 118/723 R |
| 2023/0230840 A1* | 7/2023 | Lee | ................... | H01L 21/31116 216/106 |

FOREIGN PATENT DOCUMENTS

JP 2005-244065 A 9/2005

* cited by examiner

*Primary Examiner* — Srinivas Sathiraju
(74) *Attorney, Agent, or Firm* — XSENSUS LLP (57) ABSTRACT

A temperature control method of a chamber of a plasma processing apparatus includes: (a) providing a substrate in the chamber; (b) measuring a pre-processing temperature of an internal component of the chamber; (c) determining a temperature control condition based on a difference between the pre-processing temperature measured in (b) and a target temperature that has been preset in advance; (d) performing a process including at least one of increasing the temperature of the internal component by a first plasma of a first processing gas and cooling the internal component by purging the chamber with a cooling gas, based on the temperature control condition; and (e) processing the substrate with a second plasma of a second processing gas.

18 Claims, 5 Drawing Sheets

TEMPERATURE CONTROL METHOD AND TEMPERATURE CONTROL DEVICE

CROSS-REFERENCE TO RELATED APPLICATIONS

This application is based on and claims priority from Japanese Patent Application No. 2021-085183, filed on May 20, 2021, with the Japan Patent Office, the disclosure of which is incorporated herein in its entirety by reference.

TECHNICAL FIELD

The present disclosure relates to a temperature control method and a temperature control device.

BACKGROUND

Japanese Laid-Open Patent Publication No. 2005-244065 discloses a plasma processing apparatus which generates plasma in a processing chamber for a processing time that has been preset according to a processing history, and heats the inner surface of the processing chamber to control the temperature of the inner surface, prior to processing a wafer completed with a cleaning process.

SUMMARY

According to an aspect of the present disclosure, a temperature control method of a chamber of a plasma processing apparatus includes: (a) providing a substrate in the chamber; (b) measuring a pre-processing temperature of an internal component of the chamber; (c) determining a temperature control condition based on a difference between the pre-processing temperature measured in (b) and a target temperature that has been preset in advance; (d) performing a process including at least one of increasing the temperature of the internal component by a first plasma of a first processing gas and cooling the internal component by purging the chamber with a cooling gas, based on the temperature control condition; and (e) processing the substrate with a second plasma of a second processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment for performing the present disclosure will be described with reference to the drawings. In the descriptions herein and the drawings, substantially the same components will be denoted by the same reference numerals, and overlapping descriptions thereof will be omitted. Further, in order to facilitate the understanding, the dimension of each unit in the drawings may be different from the actual dimension.

The directions such as, for example, parallel, orthogonal, perpendicular, horizontal, vertical, upward/downward, and left/right allow a deviation that does not impair effects of the embodiment. The shape of each unit is not limited to the right angle, and may be rounded in a bow shape. The parallel, orthogonal, perpendicular, horizontal, and vertical may include substantially parallel, substantially orthogonal, substantially perpendicular, substantially horizontal, and substantially vertical.

Figure 1:
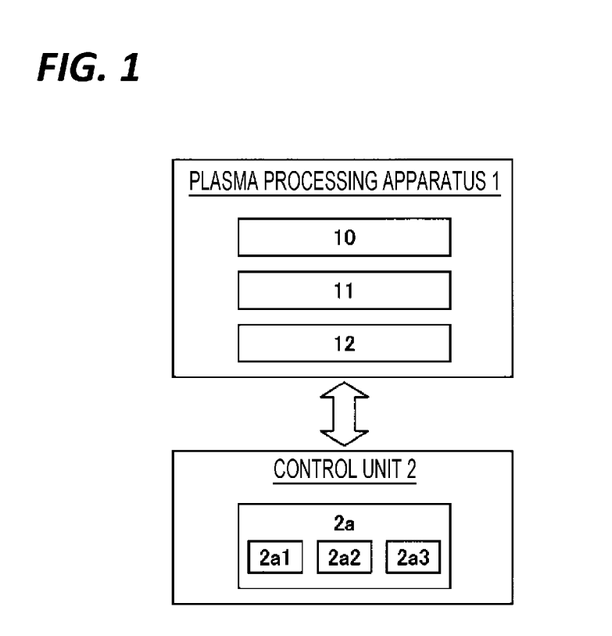
FIG. 1 is a view illustrating an example of a configuration of a plasma processing system according to an embodiment of the present disclosure.

First, a plasma processing system according to an embodiment of the present disclosure will be described. FIG. 1 is a view illustrating an example of a configuration of the plasma processing system according to the present embodiment.

In an embodiment, the plasma processing system includes a plasma processing apparatus 1 and a control unit 2. The plasma processing apparatus 1 includes a plasma processing chamber 10, a substrate support 11, and a plasma generation unit 12. The plasma processing chamber 10 includes a plasma processing space. Further, the plasma processing chamber 10 includes at least one gas supply port for supplying at least one processing gas to the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support 11 is disposed in the plasma processing space, and has a substrate support surface for supporting a substrate.

The plasma generation unit 12 is configured to generate plasma from at least one processing gas supplied in the plasma processing space. The plasma formed in the plasma processing space may be capacitively coupled plasma (CCP), inductively coupled plasma (ICP), electron-cyclotron-resonance (ECR) plasma, helicon wave plasma (HWP), or surface wave plasma (SWP). Further, various types of plasma generation units, which include an alternating current (AC) plasma generation unit and a direct current (DC) plasma generation unit may be used. In an embodiment, an AC signal (AC power) used in the AC plasma generation unit has a frequency in the range of 100 kHz to 10 GHz. Thus, the AC signal includes a radio frequency (RF) signal and a microwave signal. In an embodiment, the RF signal has a frequency in the range of 200 kHz to 150 MHz.

The control unit 2 processes computer-executable commands for causing the plasma processing apparatus 1 to perform various steps described herein. The control unit 2 may be configured to control each component of the plasma processing apparatus 1 to perform the various steps described herein. In an embodiment, a part of the control unit 2 or the entire control unit 2 may be included in the plasma processing apparatus 1. The control unit 2 may include, for example, a computer 2a. The computer 2a may include, for example, a processing unit (central processing unit (CPU)) 2a1, a storage unit 2a2, and a communication interface 2a3. The processing unit 2a1 may be configured to perform various control operations based on programs stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as, for example, a local area network (LAN).

Figure 2:
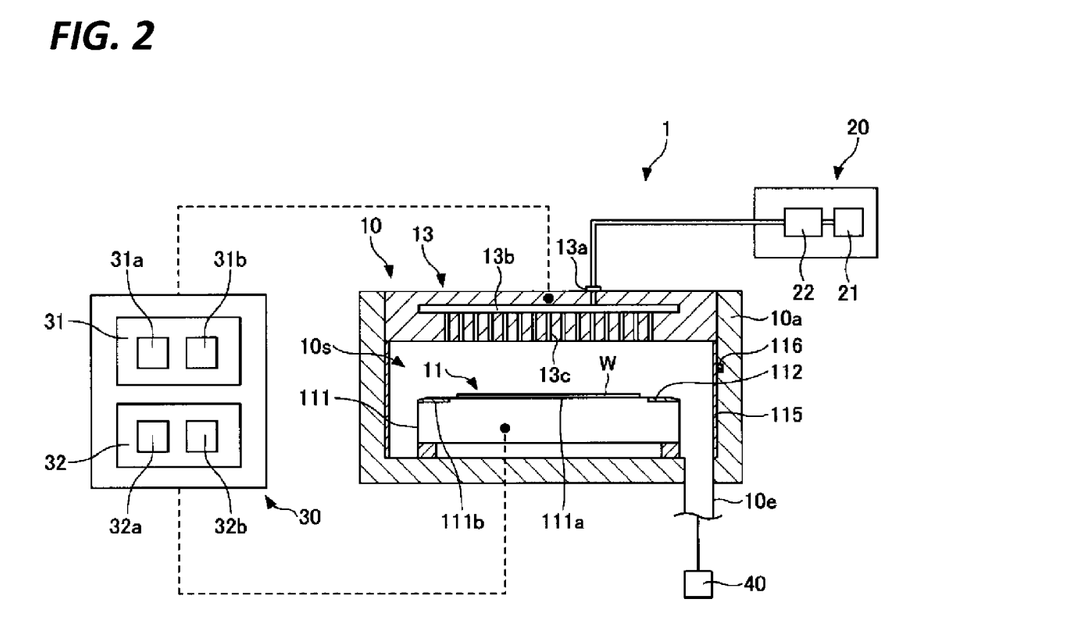
FIG. 2 is a view illustrating an example of a configuration of a plasma processing apparatus in the plasma processing system according to the embodiment.

Hereinafter, descriptions will be made on an example of a configuration of a capacitively coupled plasma processing apparatus, which is an example of the plasma processing apparatus 1, with reference to FIG. 2.

The capacitively coupled plasma processing apparatus 1 includes the plasma processing chamber 10, the gas supply unit 20, a power supply 30, and the exhaust system 40. Further, the plasma processing apparatus 1 includes the substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support 11. The side wall 10a is grounded. The shower head 13 and the substrate support 11 are electrically insulated from the housing of the plasma processing chamber 10.

The plasma processing chamber 10 includes a side wall protection member 115 on the side wall 10a that faces the substrate support 11. The side wall protection member 115 protects the side wall 10a. The side wall protection member 115 includes, for example, at least one material selected from the group consisting of quartz and ceramics. Further, the plasma processing apparatus 1 includes a temperature sensor 116 that measures the temperature of the side wall protection member 115. The temperature sensor 116 is, for example, a fluorescent optical fiber thermometer.

The substrate support 11 includes a main body 111 and a ring assembly 112. The main body 111 has a central region (substrate support surface) 111a for supporting a substrate (wafer) W and an annular region (ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 to surround the substrate W placed on the central region 111a of the main body 111. In an embodiment, the main body 111 includes a base and an electrostatic chuck. The base includes a conductive member. The conductive member of the base functions as a lower electrode. The electrostatic chuck is placed on the base. The upper surface of the electrostatic chuck has the substrate support surface 111a. The ring assembly 112 includes one or more annular members. At least one of the one or more annular members is an edge ring. Although not illustrated, the substrate support 11 may include a temperature adjustment module configured to adjust at least one of the electrostatic chuck, the ring assembly 112, and the substrate to a target temperature. The temperature adjustment module may include a heater, a heat transfer medium, a flow path, or a combination thereof. A heat transfer fluid such as brine or gas flows through the flow path. The substrate support 11 may include a heat transfer gas supply unit configured to supply a heat transfer gas to the space between the back surface of the substrate W and the substrate support surface 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b, and is introduced into the plasma processing space 10s from the plurality of gas introduction ports 13c. The shower head 13 further includes a conductive member. The conductive member of the shower head 13 functions as an upper electrode. The gas introduction unit may include one or a plurality of side gas injectors (SGI) attached to one or a plurality of openings formed in the side wall 10a, in addition to the shower head 13.

The gas supply unit 20 may include at least one gas source 21 and at least one flow rate control device 22. In an embodiment, the gas supply unit 20 is configured to supply at least one processing gas from the corresponding gas source 21 to the shower head 13 via the corresponding flow rate control device 22. Each flow rate control device 22 may include, for example, a mass flow controller or a pressure-controlled flow rate control device. The gas supply unit 20 may further include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power), such as a source RF signal or a bias RF signal, to a conductive member of the substrate support 11 and/or the conductive member of the shower head 13. As a result, plasma is formed from at least one processing gas supplied to the plasma processing space 10s. Thus, the RF power supply 31 may function as at least a part of the plasma generation unit 12. Further, by supplying the bias RF signal to the conductive member of the substrate support 11, a bias electric potential is generated in the substrate W, so that ion components in the formed plasma may be drawn into the substrate W.

In an embodiment, the RF power supply 31 includes a first RF generation unit 31a and a second RF generation unit 31b. The first RF generation unit 31a is coupled to the conductive member of the substrate support 11 and/or the conductive member of the shower head 13 via at least one impedance matching circuit, and configured to generate a source RF signal (source RF power) for generating plasma. In an embodiment, the RF signal has a frequency signal in the range of 13 MHz to 150 MHz. In an embodiment, the first RF generation unit 31a may be configured to generate multiple source RF signals having different frequencies. The generated one or more source RF signals are supplied to the conductive member of the substrate support 11 and/or the conductive member of the shower head 13. The second RF generation unit 31b is coupled to the conductive member of the substrate support 11 via at least one impedance matching circuit, and configured to generate a bias RF signal (bias RF power). In an embodiment, the bias RF signal has a frequency lower than that of the source RF signal. In an embodiment, the bias RF signal has a frequency signal in the range of 400 kHz to 13.56 MHz. In an embodiment, the second RF generation unit 31b may be configured to generate multiple bias RF signals having different frequencies. The generated one or more bias RF signals are supplied to the conductive member of the substrate support 11. In various embodiments, at least one of the source RF signal and the bias RF signal may be pulsed.

The power supply 30 may further include a direct current (DC) power supply 32 coupled to the plasma processing chamber 10. The DC power supply 32 includes a first DC generation unit 32a and a second DC generation unit 32b. In an embodiment, the first DC generation unit 32a is connected to the conductive member of the substrate support 11, and configured to generate a first DC signal. The generated first DC signal is applied to the conductive member of the substrate support 11. In an embodiment, the first DC signal may be applied to another electrode such as an electrode of the electrostatic chuck. In an embodiment, the second DC generation unit 32b is connected to the conductive member of the shower head 13, and configured to generate a second DC signal. The generated second DC signal is applied to the conductive member of the shower head 13. In various embodiments, the first and second DC signals may be pulsed. The first DC generation unit 32a and the second DC generation unit 32b may be provided in addition to the RF power supply 31, or the first DC generation unit 32a may be provided in place of the second RF generation unit 31b.

The exhaust system 40 may be connected to a gas discharge port 10e provided in, for example, the bottom of the plasma processing chamber 10. The exhaust system 40 may include a pressure regulating valve and a vacuum pump. The pressure regulating valve regulates the pressure in the plasma processing space 10s. The vacuum pump may include a turbo molecular pump, a dry pump, or a combination thereof.

Figure 3:
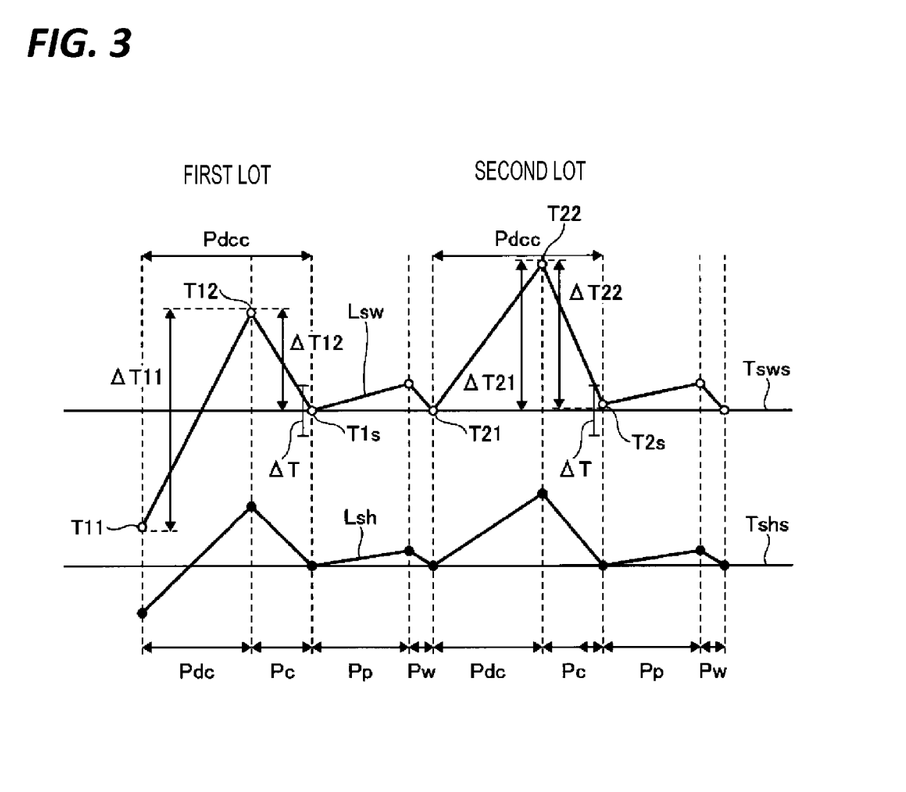
FIG. 3 is a view illustrating a temperature control performed by a control unit of the plasma processing system according to the embodiment.

Temperature Control Method of Plasma Processing Apparatus According to Present Embodiment The temperature control method of the plasma processing apparatus according to the present embodiment will be described. FIG. 3 is a view illustrating a temperature control performed by the control unit 2 of the plasma processing system according to the present embodiment.

In FIG. 3, the vertical axis represents a temperature, and the horizontal axis represents time. Further, the left side of FIG. 3 represents a first lot which is an initial lot, and the right side thereof represents a second lot which is subsequent to the first lot.

Each of the first and second lots has a dry cleaning period (period Pdc), a cooling period (period Pc), and a substrate processing period (period Pp) in this order. While FIG. 3 represents one substrate processing period (period Pp), a plurality of consecutive substrate processing periods (periods Pp) may be provided according to the number of substrates to be processed in each of the first and second lots. Further, a substrate transfer period (period Pw) may be provided after the substrate processing period (period Pp). During the substrate transfer period, the temperature of the chamber drops because there is no heat input of plasma.

No vacant time may be set between the first and second lots, or a vacant time may be set in the units of several hours or several days between the first and second lots.

The dry cleaning period (period Pdc) is a period for cleaning the inside of the plasma processing chamber 10 using plasma. During the dry cleaning period (period Pdc), the control unit 2 performs a plasma processing in the plasma processing apparatus 1 under predetermined processing conditions. During the dry cleaning period (period Pdc), the processing may be performed with a plurality of processing items.

As for the processing conditions of the plasma processing apparatus 1 during the dry cleaning period (period Pdc), for example, the pressure is 100 milli Torr (13.3 pascals), the ratio frequency power is 600 watts, the processing gas is oxygen, and the processing temperature is 120° C.

In addition to the processing conditions described above, for example, a temperature increasing rate and a temperature increasing time may be added as processing conditions. That is, when the temperature is increased by plasma, the control unit 2 sets at least one condition selected from the group consisting of the radio frequency power, the pressure inside the chamber, the type of processing gas, the flow rate of the processing gas, the temperature increasing rate, and the temperature increasing time.

When a dry cleaning process is performed, the temperature inside the plasma processing chamber 10 increases. Subsequent to the dry cleaning period (period Pdc), the control unit 2 performs a cooling process for cooling the inside of the plasma processing apparatus 1 during the cooling period (period Pc).

The cooling period (period Pc) is a period for supplying a cooling gas from the shower head 13 thereby cooling the inside of the plasma processing chamber 10. The control unit 2 performs a control to supply the cooling gas to the plasma processing apparatus 1. The plasma processing apparatus 1 supplies the cooling gas from the shower head 13 to the plasma processing space 10s. The cooling gas used in the cooling process is, for example, at least one selected from the group consisting of helium and nitrogen.

As the conditions for the cooling process, for example, at least one condition selected from the group consisting of the gas flow rate of the cooling gas and the type of cooling gas may be set. That is, when the cooling is performed by purging with the cooling gas, the control unit 2 sets at least one condition selected from the group consisting of the pressure inside the chamber, the flow rate of the cooling gas, the type of cooling gas, and the cooling time.

The dry cleaning period (period Pdc) and the cooling period (period Pc) may be collectively referred to as a temperature adjustment period (period Pdcc).

The substrate processing period (period Pp) is a period for performing a substrate processing on the wafer W. For example, the control unit 2 controls the plasma processing apparatus 1 based on a processing recipe stored in the storage unit 2a2. Then, the plasma processing apparatus 1 performs a desired substrate processing, so as to perform a processing such as etching on the wafer W.

Next, the temperatures of the shower head 13 and the side wall protection member 115 will be described. In FIG. 3, the line Lsh represents a temperature of the wall of the shower head 13 that faces the plasma processing space 10s. The line Lsw represents a temperature of the side wall protection member 115. The temperature of the side wall protection member 115 is measured by the temperature sensor 116. The temperature Tsws represents a temperature of the side wall protection member 115 that becomes stable at the end of the lot. The temperature Tshs represents a temperature of the shower head 13 that becomes stable at the end of the lot.

It is desirable that the temperature of the portions that define the plasma processing space 10s becomes constant at a desired temperature. It is assumed that the shower head 13 includes, for example, a temperature control module such that the temperature of the shower head 13 is controlled to become constant at a desired temperature.

During the dry cleaning process (period Pdc), each of the shower head 13 and the side wall protection member 115 absorbs heat from plasma, so that the temperature thereof increases. For example, in the first lot, the temperature of the side wall protection member 115 increases from a temperature T11 to a temperature T12 by a temperature difference ΔT11. In the second lot, the temperature of the side wall protection member 115 increases from a temperature T21 to a temperature T22 by a temperature difference ΔT21.

Since the substrate processing is not performed before the first lot, the temperature T11 in the first lot is lower than the temperature T21 in the second lot.

Since the temperature of the shower head 13 is controlled by the temperature control module, the temperature fluctuation of the shower head 13 due to the dry cleaning process is smaller than that of the side wall protection member 115.

During the cooling period (period Pc), each of the shower head 13 and the side wall protection member 115 is cooled by the cooling gas, so that the temperature thereof drops. For example, in the first lot, the temperature drops from the temperature T12 to a temperature T1s by a temperature difference ΔT12. In the second lot, the temperature drops from the temperature T22 to a temperature T2s by a temperature difference ΔT22.

Then, at the time when the substrate processing period (period Pp) starts, the control unit 2 controls the plasma processing apparatus 1 such that the temperatures T1s and T2s of the side wall protection member 115 fall within a temperature range ΔT centering on the temperature Tsws which is the stable temperature of the side wall protection member 115. Here, the temperature Tsws is the target temperature.

The difference between each of the temperatures T11 and T21 which are the temperatures before the dry cleaning process is performed, and the temperature Tsws which is the target temperature is obtained. Then, based on the difference between the temperatures T11 and Tsws, the processing conditions for the dry cleaning process and the processing conditions for the cooling process are changed such that the temperature T1s at the time of starting the plasma processing falls within a predetermined range. Further, based on the difference between the temperatures T21 and Tsws, the processing conditions for the dry cleaning process and the processing conditions for the cooling process are changed such that the temperature T2s at the time of starting the plasma processing falls within a predetermined range.

The temperature fluctuation of the internal component member according to the processing conditions for the dry cleaning process or the processing conditions for the cooling process may be measured in advance and stored in, for example, the storage unit 2a2. Then, based on the data stored in the storage unit 2a2, the temperatures of the internal component member according to the processing conditions for the dry cleaning process or the processing conditions for the cooling process may be estimated to determine processing conditions.

Figure 4:
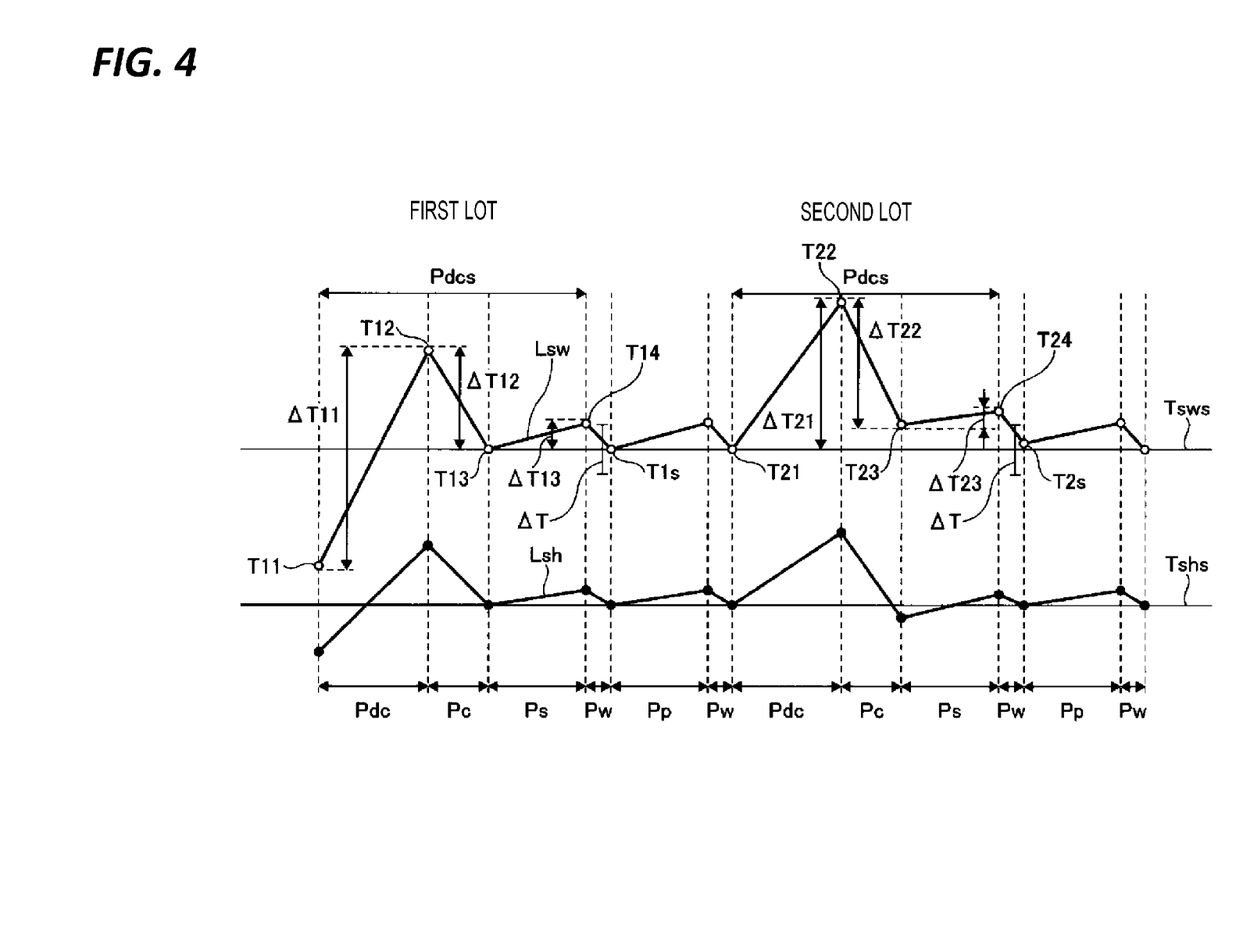
FIG. 4 is a view illustrating the temperature control performed by the control unit of the plasma processing system according to the embodiment.

After the cooling period (period Pc), a seasoning process may be performed. FIG. 4 is a view illustrating the temperature control performed by the control unit 2 of the plasma processing system according to the present embodiment.

Each of the first and second lots has a dry cleaning period (period Pdc), a cooling period (period Pc), a seasoning process period (seasoning period) (period Ps), and a substrate processing period (period Pp) in this order. While FIG. 4 represents one period as the substrate processing period (period Pp), a plurality of consecutive substrate processing periods (periods Pp) may be provided according to the number of substrates to be processed in each of the first and second lots.

Since the dry cleaning period (period Pdc), the cooling period (period Pc), and the substrate processing period (period Pp) are the same as described above, descriptions thereof will be omitted.

Subsequent to the cooling period (period Pc), the seasoning process is performed. The seasoning period (period Ps) is a period for performing the seasoning process in order to stabilize the internal temperature of the plasma processing chamber 10 or the state of the internal structure.

The dry cleaning period (period Pdc), the cooling period (period Pc), and the seasoning period (period Ps) may be collectively referred to as a temperature adjustment period (period Pdcs).

Subsequent to the seasoning period (period Ps), the substrate processing is performed after a predetermined waiting period (period Pw) elapses in order to, for example, replace the substrate.

Next, the temperatures of the shower head 13 and the side wall protection member 115 will be described.

When the dry cleaning process is performed during the dry cleaning period (period Pdc), each of the shower head 13 and the side wall protection member 115 absorbs heat from plasma, so that the temperature thereof increases. For example, in the first lot, the temperature of the side wall protection member 115 increases from a temperature T11 to a temperature T12 by a temperature difference ΔT11. In the second lot, the temperature of the side wall protection member 115 increases from a temperature T21 to a temperature T22 by a temperature difference ΔT21.

Since the temperature of the shower head 13 is controlled by the temperature control module, the temperature fluctuation of the shower head 13 due to the dry cleaning process is smaller than that of the side wall protection member 115.

When the cooling process is performed during the cooling period (period Pc), each of the shower head 13 and the side wall protection member 115 is cooled by the cooling gas, so that the temperature thereof drops. For example, in the first lot, the temperature drops from the temperature T12 to a temperature T13 by a temperature difference ΔT12. In the second lot, the temperature drops from the temperature T22 to a temperature T23 by a temperature difference ΔT22.

When the seasoning process is performed during the seasoning period (period Ps), each of the shower head 13 and the side wall protection member 115 absorbs heat from plasma, so that the temperature thereof increases. For example, in the first lot, the temperature increases from the temperature T13 to a temperature T14 by a temperature difference ΔT13. In the second lot, the temperature increases from the temperature T23 to a temperature T24 by a temperature difference ΔT23.

During the waiting period (period Pw), the temperature of each of the shower head 13 and the side wall protection member 115 drops. For example, in the first lot, the temperature drops from the temperature T14 to a temperature T1s. In the second lot, the temperature drops from the temperature T24 to a temperature T2s.

Then, at the time when the substrate processing period (period Pp) starts, the control unit 2 controls the plasma processing apparatus 1, such that the temperatures T1s and T2s of the side wall protection member 115 fall within the range of the temperature range ΔT centering on the temperature Tsws which is the stable temperature of the side wall protection member 115. That is, the temperature Tsws is the target temperature.

Specifically, the difference between each of the temperatures T11 and T21 which are the temperatures before the dry cleaning process is performed, and the temperature Tsws which is the target temperature is obtained. Then, based on the difference between the temperatures T11 and Tsws, the processing conditions for the dry cleaning process and the processing conditions for the cooling process are changed such that the temperature T1s s at the time of starting the plasma processing falls within a predetermined range. Further, based on the difference between the temperatures T21 and Tsws, the processing conditions for the dry cleaning process and the processing conditions for the cooling process are changed such that the temperature T2s at the time of starting the plasma processing falls within a predetermined range. When the processing conditions are changed, the processing conditions for the seasoning process may be changed.

Figure 5:
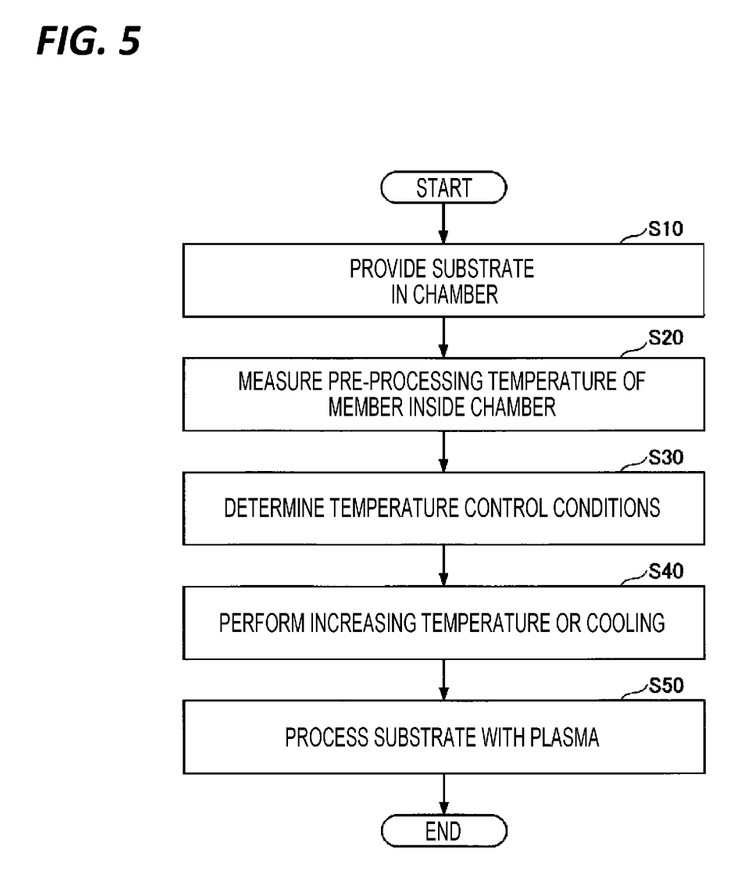
FIG. 5 is a flowchart illustrating the temperature control performed by the control unit of the plasma processing system according to the embodiment.

FIG. 5 is a flowchart illustrating the temperature control performed by the control unit 2 of the plasma processing system according to the present embodiment. The process of the temperature control method will be described below.

First, the control unit 2 places the substrate to be processed, on the substrate support 11 inside the plasma processing chamber 10 (step S10). That is, the control unit 2 executes a procedure of providing the substrate into the chamber.

Next, the control unit 2 measures the temperature of the side wall protection member 115 by the temperature sensor 116 (step S20). That is, the control unit 2 executes a procedure of measuring the pre-processing temperature of the member inside the chamber.

Next, the control unit 2 determines the temperature control conditions (step S30). That is, the control unit 2 executes a procedure of determining the temperature control conditions. Specifically, the temperature control conditions are determined based on the difference between the pre-processing temperature measured in step S20 and the target temperature. The temperature control conditions are, for example, at least one of the processing conditions for the dry cleaning period (period Pdc), the processing conditions for the cooling period (period Pc), and the processing conditions for the seasoning period (period Ps).

The temperature control conditions are determined such that the temperature of the side wall protection member 115, that is, the temperature measured by the temperature sensor 116 becomes the target temperature when the substrate processing period (period Pp) starts.

Next, the control unit 2 increases or cools the inside of the plasma processing chamber 10 based on the temperature control conditions in step S30 (step S40). That is, the control unit 2 executes a procedure of performing at least one of increasing the temperature of the internal component member by plasma and cooling the temperature of the internal component member by purging with the cooling gas based on the temperature control conditions. As described above, since the temperature control conditions are determined such that the temperature of the side wall protection member 115 reaches the target temperature when the substrate processing period (period Pp) starts, the temperature of the side wall protection member 115 falls within the predetermined range including the target temperature when the substrate processing period (period Pp) starts.

Then, the control unit 2 processes the substrate with plasma (step S50). That is, the control unit 2 executes a procedure of processing the substrate with plasma. Since the temperature of the side wall protection member 115 falls within the predetermined range including the target temperature when the substrate processing period (period Pp) starts, the fluctuation in substrate processing performance during the substrate processing may be suppressed.

The control unit 2 is an example of a temperature control device.

<Operation Effects>

According to the plasma processing apparatus 1 of the present disclosure, the fluctuation in substrate processing performance may be suppressed when a plurality of substrates is processed.

Figure 6:
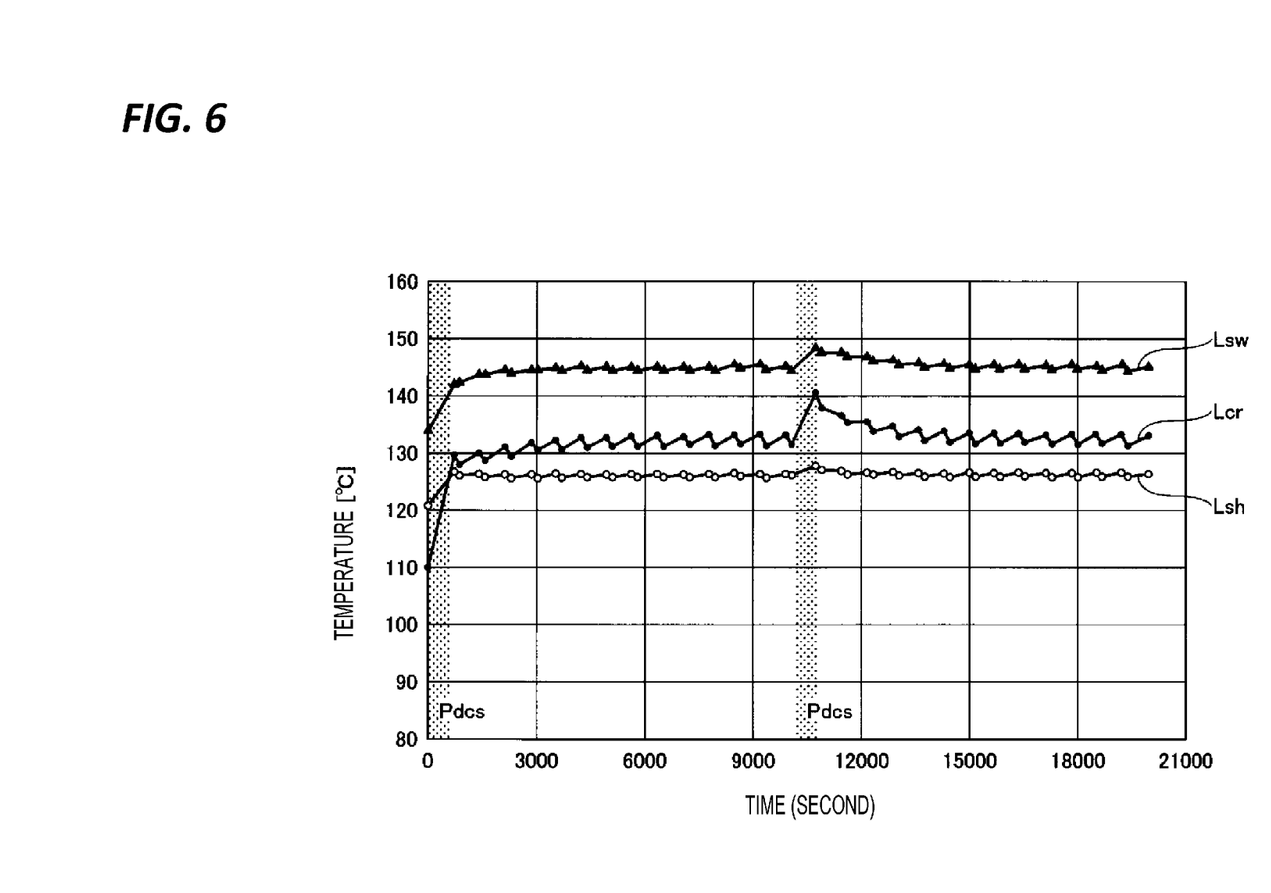
FIG. 6 is a view illustrating an example of an operation of a plasma processing system according to a comparative example.

For example, in a case where the temperature control method according to the present embodiment is not applied, the temperature of the member disposed inside the substrate processing apparatus fluctuates within and between the lots. FIG. 6 is a view illustrating the temperature characteristics of a comparative example to which the temperature control method according to the present embodiment is not applied.

The line Lsw represents the temperature of the side wall protection member 115. The line Lcr represents the temperature of one of the annular members of the ring assembly 112. The line Lsh represents the temperature of the shower head 13. In FIG. 6, the "Pdcs" indicates a temperature adjustment period including the dry cleaning period.

As illustrated in FIG. 6, in the comparative example, the temperature of the member disposed inside the substrate processing apparatus fluctuates within and between the lots. In particular, the temperatures of the side wall protection member 115 and the annular member of the ring assembly 112, which are the members disposed inside the chamber but are not subjected to the active temperature adjustment, fluctuate within and between the lots.

According to the temperature control method of the present embodiment, the temperature of the internal component member inside the plasma processing chamber is adjusted when the substrate processing is performed, so that the fluctuation caused from the temperature of the internal component member in the plasma processing chamber during the substrate processing may be suppressed. By suppressing the fluctuation caused from the temperature of the internal component member in the plasma processing chamber during the substrate processing, the fluctuation in substrate processing performance during the substrate processing may be suppressed.

In particular, when a plurality of processing substrates is processed in the units of lot, the temperature fluctuation between one lot and a subsequent lot may be suppressed, so that the fluctuation in substrate processing performance between one lot and the subsequent lot may be suppressed. Even within the same lot, the fluctuation of the temperature during the lot processing may be suppressed, so that the fluctuation in substrate processing performance during the lot processing may be suppressed.

In the descriptions above, the dry cleaning period (period Pdc) and the cooling period (period Pc) are provided. However, only one of the dry cleaning period (period Pdc) and the cooling period (period Pc) may be provided. In the descriptions above, the dry cleaning period (period Pdc) and the cooling period (period Pc) are provided in this order. However, the cooling period (period Pc) and the dry cleaning period (period Pdc) may be provided in this order. Further, the dry cleaning period (period Pdc) and the cooling period (period Pc) may be repeated a plurality of times. When the increase of the temperature is performed by plasma, plasma may be generated, without being limited to the case where the dry cleaning is performed. For example, after the temperature is increased to the target temperature by generating plasma, the generation of plasma may be stopped, thereby stopping the increase of the temperature.

The target temperature may be preset. While the target temperature is the stable temperature Tsws in the descriptions above, the target temperature is not limited to the temperature Tsws. The preset target temperature may be, for example, a saturation temperature when a plurality of substrates is processed. The saturation temperature indicates a stable temperature reached when a plurality of substrates is processed. The target temperature may be set depending on a machine difference or an individual difference of the temperature sensor.

In the descriptions above, the side wall protection member 115 is described as the internal component member. However, the internal component member is not limited to the side wall protection member 115. The internal component member may be a member provided inside the plasma processing chamber 10, for example, the annular member (e.g., a cover ring) that makes up the ring assembly 112, a protection member that protects the end of the shower head 13, or a baffle plate provided in an exhaust passage.

According to the present disclosure, the fluctuation in substrate processing performance may be suppressed when a substrate processing is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A temperature control method comprising:
  (a) providing a substrate in a chamber of a plasma processing apparatus;
  (b) measuring a pre-processing temperature of an internal component of the chamber;
  (c) determining a temperature control condition based on a difference between the pre-processing temperature measured in (b) and a target temperature that has been preset in advance;
  (d) performing a process including at least one of increasing a temperature of the internal component by a first plasma of a first processing gas and cooling the internal component by purging the chamber with a cooling gas, based on the temperature control condition; and
  (e) processing the substrate with a second plasma of a second processing gas.

2. The temperature control method according to claim 1, further comprising:
  performing a seasoning process prior to (e).

3. The temperature control method according to claim 2, wherein the internal component includes at least one material selected from the group consisting of quartz and ceramics.

4. The temperature control method according to claim 3, wherein the plasma processing apparatus includes a sensor that measures the temperature of the internal component, and the sensor measures the pre-processing temperature of the internal component.

5. The temperature control method according to claim 4, wherein in (d), when the temperature of the internal component is increased by the first plasma, at least one condition selected from the group consisting of a radio frequency power, a pressure inside the chamber, a type of processing gas, a flow rate of the processing gas, a temperature increasing rate, and a temperature increasing time is set.

6. The temperature control method according to claim 5, wherein in (d), when the internal component is cooled by the purging with the cooling gas, at least one condition selected from the group consisting of the pressure inside the chamber, a flow rate of the cooling gas, a type of the cooling gas, and a cooling time is set.

7. The temperature control method according to claim 6, wherein the cooling gas includes at least one selected from the group consisting of helium and nitrogen.

8. The temperature control method according to claim 7, wherein the increasing the temperature of the internal component includes stop increasing the temperature after the temperature is increased to the target temperature which has been preset in advance.

9. The temperature control method according to claim 8, wherein the target temperature is a saturation temperature when a plurality of substrates is processed.

10. The temperature control method according to claim 1, wherein the internal component includes at least one material selected from the group consisting of quartz and ceramics.

11. The temperature control method according to claim 1, wherein the plasma processing apparatus includes a sensor that measures the temperature of the internal component, and the sensor measures the pre-processing temperature of the internal component.

12. The temperature control method according to claim 1, wherein in (d), when the temperature of the internal component is increased by the first plasma, at least one condition selected from the group consisting of a radio frequency power, a pressure inside the chamber, a type of a processing gas, a flow rate of the processing gas, a temperature increasing rate, and a temperature increasing time is set.

13. The temperature control method according to claim 1, wherein in (d), when the internal component is cooled by the purging with the cooling gas, at least one condition selected from the group consisting of the pressure inside the chamber, a flow rate of the cooling gas, a type of the cooling gas, and a cooling time is set.

14. The temperature control method according to claim 1, wherein the cooling gas includes at least one selected from the group consisting of helium and nitrogen.

15. The temperature control method according to claim 1, wherein the increasing the temperature of the internal component includes stop increasing the temperature after the temperature is increased to the target temperature which has been preset in advance.

16. The temperature control method according to claim 1, wherein the target temperature is a saturation temperature when a plurality of substrates is processed.

17. A temperature control device of a substrate processing apparatus,
  wherein the temperature control device executes a process including:
  (a) providing a substrate in a processing chamber of the substrate processing apparatus;

(b) measuring a pre-processing temperature of an internal component of the processing chamber using a sensor;
(c) determining a temperature control condition based on a difference between the pre-processing temperature measured in (b) and a target temperature that has been preset in advance;
(d) performing a sub-processing including at least one of increasing the temperature of the internal component by a first plasma of a first processing gas and cooling the internal component by purging the processing chamber with a cooling gas, based on the temperature control condition, and
(e) processing the substrate with a second plasma of a second processing gas.

18. A temperature control device of a substrate processing apparatus, the temperature control device comprising:
a memory; and
a CPU coupled to the memory and configured to:

(a) provide a substrate in a processing chamber of the substrate processing apparatus;
(b) measure a pre-processing temperature of an internal component of the processing chamber using a sensor;
(c) determine a temperature control condition based on a difference between the pre-processing temperature measured in (b) and a target temperature that has been preset in advance;
(d) perform a sub-processing including at least one of increasing the temperature of the internal component by a first plasma of a first processing gas and cooling the internal component by purging the processing chamber with a cooling gas, based on the temperature control condition, and
(e) process the substrate with a second plasma of a second processing gas.

* * * * *